United States Patent [19]

Yamano et al.

[11] Patent Number: 4,971,858
[45] Date of Patent: Nov. 20, 1990

[54] SHEETS FOR FORMATION OF PATTERNS AND METHODS FOR FORMING AND FIXING PATTERNS

[75] Inventors: Minoru Yamano, Ibaraki; Masaaki Shimada, Kawachinagano, both of Japan

[73] Assignee: Sigmax, Ltd., Osaka, Japan

[21] Appl. No.: 296,052

[22] PCT Filed: Apr. 5, 1988

[86] PCT No.: PCT/JP88/00342
§ 371 Date: Dec. 5, 1988
§ 102(e) Date: Dec. 5, 1988

[87] PCT Pub. No.: WO88/07937
PCT Pub. Date: Oct. 20, 1988

[30] Foreign Application Priority Data

Apr. 6, 1987 [JP] Japan .................................. 62-85032
Jul. 17, 1987 [JP] Japan ................................. 62-179832

[51] Int. Cl.$^5$ ............................................ B32B 5/16
[52] U.S. Cl. .................................. 428/323; 428/195;
428/206; 428/207; 428/208; 428/209; 428/210;
428/325; 428/328; 428/329; 428/364; 428/913;
428/914
[58] Field of Search .......................... 428/206–210,
428/325, 913, 914, 323, 195, 328, 329, 364

[56] References Cited

U.S. PATENT DOCUMENTS 2,359,462 10/1944 Bricker .................................. 428/210

Primary Examiner—Pamela R. Schwartz
Attorney, Agent, or Firm—Larson and Taylor

[57] ABSTRACT

The present invention provides:

(1) a sheet for forming a pattern, the sheet including a substrate which has an ink homogeneously distributed in the surface portion or interior thereof, said ink containing an inorganic compound and a glass frit;

(2) a ribbon for printing produced by cutting the pattern-forming sheet to specific width;

(3) an ink ribbon cartridge produced by accommodating the ribbon for printing into a casing;

(4) A method for forming and fixing a pattern in which a pattern is formed on an object using the sheet described above in (1) and is fired;

(5) an ink-receiving type, firing, flexible sheet having an adhesive layer and an ink-receiving layer, the ink-receiving layer containing an inorganic compound and a glass frit and being formed on one surface of the adhesive layer;

(6) a support of an ink-receiving type, firing, flexible sheet which comprises a releasable substrate formed on the other surface of the adhesive layer to cover the same;

(7) a material for producing a label for firing which has a pattern formed on the ink-receiving layer of the support of the flexible sheet with an ink containing a glass frit and an inorganic compound different from the inorganic compound present in the ink-receiving layer; and (8) a support of the material for producing a label for firing which comprises a releasable substrate formed on the other surface of the adhesive layer to cover the same.

5 Claims, 2 Drawing Sheets

SHEETS FOR FORMATION OF PATTERNS AND METHODS FOR FORMING AND FIXING PATTERNS

TECHNICAL FIELD

The present invention relates to sheets for forming patterns, and ribbons for printing and ink ribbon cartridges produced using said sheets, and ink-receiving type, flexible sheets for firing and labels for firing using said flexible sheets and supports thereof, and methods for forming and fixing patterns using them.

PRIOR ART PROBLEMS

In the technical area requiring the fixing of such formed patterns by firing as glazing on porcelain, circuit patterns on thick film hybrid integrated circuits, patterns as electrodes, resistances, dielectrics or the like on electronic parts and the like, methods for formation and fixing of patterns have been heretofore carried out which comprise preparing a pasty ink from a mixture of a pigment, a material for a conductor, resistance, dielectric or the like, a glass frit and a binder, printing a pattern on a substrate with the pasty ink by screen-printing or other technique, and firing the printed pattern. However, the screen-printing technique, although suitable for mass-producing a single kind of product, has the problems of being time-consuming and costly in preparation from a block copy to a screen, hence low in productive efficiency. With this drawback, the technique is not suited to multikind and small-quantity production, testing of products and the like. Known methods for transfer of patterns to substrates include direct printing methods, methods able to transfer the printed patterns on transfer paper by water slide transfer technique or other means and so on. Yet these methods have posed the problems of difficulties in printing on a curved surface, automation of printing, etc.

To overcome the foregoing problems, we have attempted to practice a method in which patterns are depicted with XY plotter or the like over carbon paper or to use various printers, currently in wide use, capable of forming the desired patterns by dotting. However, the carbon paper used under the plotter and the ribbons for printing for use in the printers have the following fundamental drawbacks.

Known sheets for forming patterns such as carbon paper, ribbons for printing or the like include, for example, those prepared by kneading and dispersing wax, a binder, a pigment of each color such as carbon black and the like to give a paste and coating a film of polyethylene terephthalate or other material with the paste or impregnating the paste into cloth, etc. Since the sheets of this type are intended for exclusive use in printing or transfer of patterns, the sheets when used for said method involving the firing at about 300° to about 1400° C. cause the patterns formed thereon to burn out or to change the properties, failing to provide a satisfactory degree of patterns or prints.

Consequently, technical means suitable for multikind and small-quantity production has been substantially unavailable for the formation of patterns to be fixed by firing.

The formation of patterns to be fired is applied not only to means for manufacture of such goods as described above at the beginning of the description.

Certain of current processes for multikind and small-quantity production require, in view of purpose of the process, heat treatment, treatment with chemicals such as acids or alkalis, various surface treatments or the like. The production control of products in such process has increasingly necessitated the attachment of control labels to starting materials or semi-manufactured products to vary the conditions in each procedure from product to product according to the information indicated on the label.

Such control labels require the formation of patterns for recognition, each different from others, namely the formation of multikind and small-quantity patterns. Further the labels must be excellent in heat resistance, chemical resistance and durability.

Heat-resistant, chemical-resistant and durable labels heretofore used for control of goods made of, e.g. glass, metals or sintered ceramics include those formed on a substrate such as sheets or enamelled sheets of fired ceramics, stainless steel or the like. However, these labels have the following various problems.

(i) The labels can not be adhered to a curved surface because the substrates used are generally flat and low in flexibility. Further the labels are difficult to adhere directly or automatically to products except by cumbersome means such as fastening with screws or insertion into pockets.

(ii) The substrates used have low flexibility, making it difficult to conduct automatic printing with a printer or the like and thus to issue labels in situ in the production line of a plant. Consequently control labels with patterns different from each other can not be issued in immediate response to the change in the list of products which frequently occurs in an automated production line designed for multikind and small-quantity production.

(iii) The materials for the labels are expensive, rendering it difficult to use labels as throwaways respectively for each product.

MEANS FOR OVERCOMING THE PROBLEMS

No technique has been available to cope with the multikind and small-quantity production and automation in the technical area requiring the fixing of patterns by firing as described above. Moreover, while the fired patterns are generally outstanding in heat resistance, chemical resistance and durability, the substrates for patterns to be fixed on generally have a pronouncedly poor flexibility. Consequently the various problems as exemplified above on the control labels and others have been presented on such grounds. In such situation, we have attempted to provide technical means for radically solving these problems.

The present invention includes materials for forming and fixing patterns, i.e. pattern-forming sheets usable in multikind and small-quantity production, such as ribbons for printing, carbon paper or the like; ink-receiving type, flexible sheets for firing which have the flexibility required of the substrate for fixing patterns; supports assuring the ease in handling of such flexible sheets; such flexible sheets having patterns formed on the surface thereof and to be fired for use as labels; development of supports assuring the handleability thereof, and methods for effectively forming and fixing patterns using these materials.

First, the substrate of said sheet for forming patterns contains an ink homogeneously distributed in the surface portion and/or the interior, the ink containing an inorganic compound and a glass frit, so that the pattern transferred to the surface of object is firmly fixed to the object with the inorganic compound as enclosed therein because the glass frit is fused by firing.

When the ink further contains an organic binder and/or wax, the pattern can be temporarily fixed to the object before firing.

Useful inorganic compounds are, for example, inorganic pigments, metallic powders, metallic oxide powders, etc.

If the substrate is coated or impregnated with the ink, it is convenient to handle. When cut to a specific width for use as ink ribbons for printing or accommodated in a casing for use as ink ribbon cartridges, such sheet is rendered easy to use with printers and especially convenient.

If such pattern-forming sheet is placed on the surface of an object, the ink can be easily transferred to the surface thereof. The transferred pattern can be securely fixed to the object by subsequent firing of the object.

In the foregoing pattern-forming and -fixing method, the pattern can be transferred directly to an intended object by use of a thermal-transfer type printer, dot impact type printer or wire-dot type printer able to print by dotting with use of said ink ribbon or the like. Optionally the pattern may be transferred first to known transfer paper and then to an object from the transfer paper. It is also possible to use flexible sheets of the special type to be described later according to the invention, or instead, sheets or foils of stainless steel or other metals. The patterns formed on these sheets can be fixed to an object having a curved surface without difficulty.

If the ink-receiving type, flexible sheet for fixing patterns by firing has an ink-receiving layer containing an inorganic compound and a glass frit and formed on one surface of an adhesive layer of organic macromolecular resin or the like with or without other flexible support member interposed therebetween, the sheet can be temporarily fixed until firing with the adhesive layer adhered to the object.

Moreover, during firing the adhesive layer burns out and the glass frit is fused and welded to an intended object, enclosing the ink and the inorganic compound therein so that the ink and the inorganic compound remain unchanged on firing, leading to accomplishment of desired fixing of pattern.

Since the ink-receiving layer contains the inorganic compound and glass frit both inherently low in flexibility, an organic binder incorporated in the ink-receiving layer imparts more flexibility to the resulting ink-receiving type, heat-resistant, flexible sheet for firing.

Inorganic pigments to be described later can be used as inorganic compounds, and fibers of inorganic compounds serve to afford a further improved flexibility.

While the sheet of the invention generally has a self-supporting property afforded by a degree of rigidity of the ink-receiving layer, the strength of the sheet may be enhanced by forming the ink-receiving layer on one surface of the adhesive layer with a support member of metallic mesh or like material formed therebetween.

Even with the flexibility and strength improved achieved in this way, a support of the ink-receiving type, firing, flexible sheet is desirably provided to protect the adhesive layer and to assure the handleability from the viewpoints of handling and maintenance, said support comprising a releasable substrate formed on the other surface of the adhesive layer to cover the same.

This ink-receiving type, firing, flexible sheet can be used as a material for producing a label for firing to provide a sharp contrast by forming a pattern with an ink containing a glass frit and an inorganic compound different from the inorganic compound present in the ink-receiving layer.

It is convenient to handle if a support of said material to be fired for labels is provided which comprises a releasable substrate formed on the adhesive layer to cover the same.

If a pattern is formed on the ink-receiving layer of the ink-receiving type, firing, flexible sheet with an ink containing a glass frit and an inorganic compound different from the inorganic compound in the ink-receiving layer, the subsequent firing assures the fixing of the pattern formed.

If the formation and fixing of pattern are performed by transferring the ink from the pattern-forming sheet of the present invention to the ink-receiving type, firing, flexible sheet of the invention, automatic attachment can be done by a robot with higher efficiency in an manner suited to multikind and small-quantity production.

Furthermore, if the ribbon for printing according to the invention is used for the formation of patterns and the transfer is carried out by a thermal-transfer type printer, impact type printer or wire-dot type printer, the desired pattern can be immediately formed with further improved efficiency according to the instructions from a computer.

This pattern-forming method provides an effective way to form patterns in multikind and small-quantity production or testing of products such as glazing on porcelain and circuit patterns on thick film hybrid integrated circuit as exemplified hereinbefore, or to form patterns on materials for labels for control of products or goods to be used in production line, distribution process or the like or to form patterns for control on products or goods at a production line, distribution process or the like.

Stated more specifically, the ink to be used for pattern-forming sheets and ribbons for printing produced from the same according to the invention comprises a glass frit and, inorganic pigment, metallic powder, metallic oxide powder or the like.

Useful glass frits can be any of those heretofore known.

Useful inorganic pigments can be any of known ones including red pigments, blue pigments, black pigments, natural mineral pigments and the like. Useful red pigments can be any of known ones containing ions of at least one of metals such as iron, chromium, copper, gold and selenium, including $MnO-Al_2O_3$, $Cr_2O_3-SnO_2$, $Fe_2O_3$, $CdS-SeS$, etc. Useful blue pigments can be any of known ones containing ions of at least one of metals such as copper, manganese, iron and cobalt, including $CoO$, $ZrO_2-V_2O_3$, $Cr_2O_3-V_2O_5$, etc. Useful black pigments can be any of known ones containing ions of at least one of metals such as iron, manganese, copper, chromium and cobalt, including $Cr_2O_3-CoO-Fe_2O_3-MnO_2$, etc.

Useful metallic powders can be any of those useful for printing or formation of patterns in screen-printing methods. Examples are powders of monometallic substances or powders of alloys thereof, examples of the monometallic substances being silver, gold, platinum, palladium, copper, nickel, tungsten and the like which are usable as, e.g. materials for forming conductors in electronic circuits. Useful metallic oxide powders are those other than metallic oxide powders useful as said pigment. Specific examples are ruthenium oxide and like resistances, barium titanate and like dielectrics, etc. The particle size of metal particles or metallic oxide particles is not specifically limited and can be suitably determined. Usually used are the metal particles or metallic oxide particles of about 0.1 to about 20 μm particle size.

The amounts of said components for the ink are not specifically limited and can be suitably determined according to a particular purpose of formation of patterns. Usually the ink contains about 1.0 to about 60% by weight of the glass frit and about 10 to about 80% by weight of at least one of inorganic pigments, metallic powders and metallic oxide powders.

Preferably the ink useful for the pattern-forming sheet and the ribbon for printing according to the invention contains an organic binder and/or wax. Useful organic binders and wax can be any of those heretofore known including polyamide resins, petroleum resins, styrene resins, paraffin wax, carnauba wax, etc. The amounts of organic binder and/or wax are not specifically limited and can be suitably determined. Usually about 10 to about 50% by weight thereof is incorporated in the ink.

The ink may further contain at least one of a dispersing agent, flexibilizer, solvent and foaming agent according to a particular purpose of forming patterns. Useful dispersing agents can be any of those commercially available. Usable as the flexibilizer is any of known ones including oil fats, mineral oil, rape oil, vaseline, xylene resin, etc. Useful solvents can be any of known ones including toluene, isopropanol, solvent naphtha, etc. The amounts of these additives are not specifically limited and can be suitably determined according to the particular purpose. The ink may further incorporate a material capable of foaming at high temperatures such as sodium silicate (water glass) prepared from silicon dioxide and sodium oxide. The pattern formed with such ink is bulged on introduction of the sheet into a furnace for firing with the result that after the firing temperature is reached, the pattern thus bulged is fixed as it is. The ink can be prepared by kneading said components by usual method. Kneading devices which can be used for this purpose can be any of known ones such as roll mill, pot mill, three-roll mill, etc.

The films useful for the pattern-forming sheets and the ribbons for printing according to the invention can be any of those heretofore employed in making ribbons for printing or the like, including films of synthetic resins such as polyethylene terephthalate, Teflon, polyimide or the like and fiber fabrics of nylon, polyester or the like.

According to the present invention, the ink can be applied to or impregnated into the film by any of known coating or impregnating methods.

The pattern-forming sheet or ribbon for printing thus obtained can be used in printers involving the manual press to be partially done or the dotting and can form the desired patterns or prints directly on the substrate or on transfer paper. Any of the following methods using the printer can be employed in, for example, glazing porcelain, formation of circuit patterns on thick film hybrid integrated circuits or formation of patterns as electrodes, resistances, dielectrics or the like on electronic parts: (1) a method in which the desired pattern is printed directly on a substrate and fired, (2) a method in which the desired pattern is printed on transfer paper useful in glazing porcelain or the like, the printed pattern is transferred to an intended substrate and the formed pattern is fired, and (3) a method in which the desired pattern is printed by transfer on the ink-receiving type, firing, flexible sheet of the present invention and the sheet is attached to an intended substrate by a robot or the like to form a pattern, followed by firing of the formed pattern. The ribbons for printing according to the invention can be used selectively depending on the kind of substrate for patterns to be printed on, the printer and the like to serve as, for example, ribbons for thermal transfer, onetime film ribbons for impact printer, fabric ribbons for impact printer or the like.

The pattern-forming sheets or ribbons for printing according to the invention can be used, e.g., for preparation of a design for a figure to be formed on porcelain, glassware, enamelled articles or the like, formation of circuit patterns on thick film hybrid integrated circuits, or formation of patterns for bar code labels on substrates of ceramics or like heat-resistant materials.

When the ink-receiving type, firing, heat-resistant, flexible sheet of the invention is used as, for example, a label for recognition, preferred inorganic compounds forming the ink-receiving layer of said sheet are those able to produce a sharp contrast between the pattern and the ink-receiving layer after firing. For example, if the ink-receiving layer has a white or whitish color, useful inorganic compounds are powders of metallic oxide type ceramics such as $SiO_2$, $ZrO_2$, $TiO_2$, $Al_2O_3$, CaO and the like, and metallic compounds such as carbonates, nitrates, sulfates, phosphates or the like which are converted into such metallic oxides on oxidation at a temperature for firing the label. These metallic oxides and metallic compounds are usable singly or at least two of them can be used in mixture, when so required. The flexibility can be enhanced also by incorporating ceramics fibers such as alumina fibers, glass fibers, carbon fibers or like fibers of inorganic compounds.

The glass frit which is the other component forming the ink-receiving layer serves as a shape-retaining agent for retaining the metallic oxide in the form of sheet after firing at about 400° to about 1700° C. The kind of useful glass frits is not specifically limited and is selected, depending on the kind of object for the pattern to be fixed on or other factors, from those which can soften or melt at a temperature range of about 400° to about 1700° C. It is preferred to use, for example, lead glass type in firing at a low temperature range of about 400° to about 600° C., borosilicate lead glass type, soda glass type or the like in firing at a medium temperature range of about 500° to about 1000° C., or silicate glass type, quartz glass type or the like in firing at a high temperature range of about 900° C. or higher. Preferred glass frits are those which have a color similar to the color of ceramics coexisting therewith after firing, thereby giving a sharp contrast between the pattern and the ink-receiving layer.

When the ink-receiving type, firing, flexible sheet is used for transferring figures after printing, the glass is preferably fused to an extent sufficient to fully enclose the pigment of the ink therein after firing. The inorganic compound to be incorporated in the ink-receiving layer is selected from those which have a color well matching the pattern.

In attaching a printed circuit pattern to a substrate, glass and inorganic compound are preferably selected in view of needs to assure sufficient adhesion after firing and to produce a pinhole-free, crack-free layer.

The organic binder which is used to shape the inorganic compound and the glass frit into a sheet is required to fully decompose and burn out during firing without leaving any ash and to provide the sheet with strength, flexibility and like properties for use as labels. Since the organic binder tends to decompose and burn out incompletely at a low firing temperature, leaving the unburnt, this tendency must be considered in selection of organic binder. Suitable organic binders are nitrocellulose type, acrylic resin type and the like. In firing at high temperatures, the selection of organic binder is not so narrowly limited as above and useful organic binders include other binders as well as those shown above, including urethane type, ethyl cellulose type, polyvinyl butyral type and the like. When the binder incompletely decomposes and burns out during firing because of firing at low temperatures, it is preferred to use as a combustion improver a known peroxide (such as sodium peroxide, calcium peroxide, magnesium peroxide or the like) in an amount of about 5 to about 15% by weight based on the weight of the binder. For use, the organic binder is usually made into an organic solvent-based solution of about 5 to about 40% by weight of concentration. Useful organic solvents are not specifically limited and include butyl carbitol, ethyl acetate, butyl cellosolve acetate, methyl ethyl ketone, methyl isobutyl ketone, toluene and the like.

The kind of inorganic compound different from that incorporated in the ink for forming a recognition pattern is not specifically limited insofar as it is excellent in heat resistance, corrosion resistance, durability and the like and it can produce a sharp contrast between the pattern and the sheet substrate after firing. When the sheet substrate is white or whitish in color, useful organic compounds are, for example, oxides of a single metal such as Fe, Cr, Co or Mn and oxides containing at least two of these metals, mixtures of at least two of these metal oxides, black pigments commonly employed for printing a figure on porcelain, and so on.

While the glass frit to be incorporated in the ink may be the same as the frits useful for the ink-receiving layer, preferred frits are those which do not affect the color of the pattern formed after firing.

Organic binders and organic solvents useful for preparation of the ink include those exemplified above.

Since it is desirable in the invention to provide a sharp contrast between the ink-receiving layer and the pattern, said inorganic compound useful for the ink-receiving layer can be replaced by the inorganic compound usable for the ink. Because a clear difference in color between the ink-receiving layer and the recognition pattern serves to assure a precise control of goods, inorganic compounds capable of producing such difference in color may be selectively used as each component.

The ink-receiving type, firing, flexible sheets of the invention can be prepared usually by the following process. First, 100 parts by weight of a mixture of 3 to 90% by weight of inorganic compound and 97 to 10% by weight of glass frit is mixed with a solution of organic binder in an amount of about 20 to about 80 parts by weight calculated as solids. The mixture is kneaded into a paste which is then shaped into a sheet. The sheet can be also formed by coating a substrate film as a separate body with the paste. The proportions of inorganic compound and glass frit can be determined depending mainly on the temperature for firing the sheet, the surface smoothness of the sheet and other factors. When the firing temperature is low and a high degree of surface smoothness is required of the sheet, a large amount of low melting glass frit is used. On the other hand, when a high firing temperature is employed and the surface smoothness is not critical, an inorganic compound is used in large quantity. In this way, an ink-receiving type, firing, flexible sheet can be obtained.

For production of a material for a label for firing according to the invention, an ink is prepared at the same time by mixing a solution of about 5 to about 50 parts by weight of organic binder calculated as solids with 100 parts by weight of a mixture of 5 to 90% by weight of other inorganic compound and 95 to 10% by weight of glass frit and kneading the mixture.

The ink thus obtained is applied to the flexible sheet to form a specific pattern, whereby a material for producing labels for firing is given according to the invention. The form of patterns can be any of figures, circuit patterns and, when for recognition purpose, any desired identification mark such as bar codes, symbols for indication of the name of company, name of product, recipient of goods, country for exporting and the like. The pattern can be formed in a plurality of colors. A pattern may be screen-printed directly on a sheet or may be formed by transfer printing using a thermal-transfer ribbon, or a dot impact ribbon. The ink-receiving type, firing, flexible sheet and a material for producing labels for firing according to the invention are advantageous to handle if they are coated, on the surface thereof for forming a pattern and the other surface thereof than the pattern-forming surface, with an adhesive to give an adhesive layer which is covered with a releasable substrate as adhered thereto, such as a releasable film or releasable paper. An adhesive useful for this use is selected from adhesives which will decompose and burn out by firing. For use in this case, the releasable film or releasable paper is removed from the sheet or material and is adhered to an object with an adhesive and fixed thereto, following by firing at a predetermined temperature of about 400° to 1700° C. Optionally the sheet or material may be pasted to the object by water-slide transfer method and fired.

The term "object" used herein refers to any of articles which will not deform by firing, and which include, of course, porcelain, ceramics substrates, goods to be controlled, pallets useful for the purpose and the like.

Effects of the Invention

By use of the pattern-forming sheet and ribbon for printing according to the invention, the desired patterns and prints can be easily provided by the pattern-forming method which has been heretofore considered to entail difficulty in giving the desired patterns and prints and which essentially involves firing, and a far higher degree of labor savings and much higher efficiency can be achieved than the screen-printing method heretofore employed. Consequently the use thereof is suitable for any of single kind and mass production, and multikind and small-quantity production.

The ink-receiving type, firing, flexible sheet and materials for producing labels for firing according to the invention are inexpensive to manufacture and have high flexibility so that they can be used by being attached with ease directly to articles of any shape. Since patterns can be readily formed and fixed on a work site according to the invention, it is possible to immediately cope with the variation in the production line which frequently takes place in an automated plant needed to perform multikind and small-quantity production. Further the firing makes the sheet and the material into a sintered body excellent in heat resistance, corrosion resistance, water resistance, durability and the like, thereby making it possible to achieve a reliable degree of fixing of patterns.

EXAMPLE

The invention will be explained in more detail referring to the examples given below.

| Example 1 (Ink ribbon for thermal transfer) | |
| --- | --- |
| Black pigment | 50 wt. % |
| Glass frit (borosilicate lead type) | 20 wt. % |
| Carnauba wax | 13 wt. % |
| Paraffin wax | 12 wt. % |
| Vaseline (flexibilizer) | 5 wt. % |

The components indicated above were kneaded in a rollmill kept at 80° C. to produce a uniform paste. The paste obtained was applied with a coater to a thin film (5 µm) of polyethyleneterephthalate and dried to form a coat about 10 µm in thickness. The flexible sheet for pattern formation thus produced was then cut to a specific width to obtain ink ribbons for thermal transfer according to the invention.

Each of the ink ribbon was wound on a roll and placed in a casing to produce an ink ribbon cartridge. The cartridge was set on a usual thermal transfer-type printer and used for forming on a transfer paper a printed shape corresponding to a desired pattern. After applying an overcoat on the transfer paper and drying the same, the printed shape was removed together with the overcoat from the transfer paper in water and transferred onto the surface of a porcelain (dish) and the dish was fired at 650° C. to produce a desired pattern on the dish.

| Example 2 (Ink ribbon for press transfer printing) | |
| --- | --- |
| Silver powder | 80 wt. % |
| Glass frit (borosilicate lead type) | 5 wt. % |
| Polyamide | 10 wt. % |
| Toluene | 5 wt. % |

The components indicated above were uniformly mixed in a stirrer to produce a paste. The paste was applied with a coater to a thin film (5 µm) of polyethyleneterephthalate (1) and dired to form a coat (3) about 15 µm in thickness, and an ink ribbon for press transfer printing was obtained (see FIG. 1).

An ink ribbon cartridge was produced using the ribbon obtained and following the procedure of Example 1. Using the ink ribbon cartridge and a conventional press transfer-type printer, a pattern form (5) corresponding to a desired pattern was directly printed on a ceramic substrate (7) and the substrate was fired at 650° C. to produce a desired circuit pattern (5') thereon (see FIG. 2).

| Example 3 (Ink ribbon for press printing) | |
| --- | --- |
| Black pigment | 60 wt. % |
| Glass frit (borosilicate lead type) | 15 wt. % |
| Rapeseed oil | 10 wt. % |
| Polyamide | 10 wt. % |

| -continued | |
| --- | --- |
| Example 3 (Ink ribbon for press printing) | |
| Toluene/iso-propanol | 5 wt. % |

The components indicated above were mixed in a three-roll mill to produce a paste. A cloth was impregnated with the paste by using a coater to form an ink ribbon for press printing.

An ink ribbon cartridge was produced using the ribbon obtained and following the procedure of Example 1. Using the ink ribbon cartridge and a usual dot matrix printer, a pattern form corresponding to a specific barcode pattern was printed on a ceramic substrate and the substrate was fired at 650° C. to manufacture a bar-code label which is excellent in heat-resistance, durability and chemical resistance.

EXAMPLE 4

The components as given in Table 1 below were uniformly mixed in a roll mill to obtain a paste. The paste was applied with a doctor blade coater to a surface of a first releasable film and dried to form a coating layer about 100 µm in thickness.

The coating layer was wound on a roll together with the first releasable film and then coated with an acrylic polymer-type adhesive with a gravure coater and dried to form an adhesive layer about 20 µm in thickness. A second releasable film was applied on the adhesive layer to obtain a flexible sheet supporting body for the ink layer.

The first releasable layer was removed to obtain an ink receiving flexible sheet for firing (see FIG. 3) comprising the second releasable film (13), the adhesive layer (11) and an ink receiving layer (9).

| TABLE 1 | |
| --- | --- |
| $ZrO_2$ | 15 parts by weight |
| Borosilicate lead-type glass frit | 85 parts by weight |
| Acrylic resin-type binder | 10 parts by weight |
| Ethylene glycol monobutyl ether acetate | 40 parts by weight |

An ink composition comprising the components indicated in Table 2 was applied by screen printing to the ink receiving layer of the above ink supporting flexible sheet to form a design (5) corresponding to a desired bar code pattern and to obtain a label supporting material for firing (see FIG. 4).

| TABLE 2 | |
| --- | --- |
| Black pigment (1) | 20 parts by weight |
| Borosilicate lead-type glass frit | 80 parts by weight |
| Ethyl cellulose-type binder | 15 parts by weight |
| Terpineol | 50 parts by weight |

Note (1): A mixed pigment of $Cr_2O_3$, $Fe_2O_3$ and CoO

After removing the second releasable film, the label supporting material was attached to the surface of a glass product through the adhesive layer and the glass product was maintained at 450° C. for 30 minutes in a furnace. During the heating process, the adhesive and the organic binder components were completely decomposed and burned out before the glass frit started to fuse, and then a black bar code pattern was formed and firmly held on the white substrate with clear contrast.

EXAMPLE 5

The composition comprising the components shown in Table 3 below was processed into a sheet in the similar manner as in Example 4 and the ink composition comprising the components shown in Table 4 was printed on the sheet by screen printing method to form a shape corresponding to a specific bar code pattern.

TABLE 3

| | |
|---|---|
| SiO$_2$ | 20 parts by weight |
| Fused quartz frit | 80 parts by weight |
| Acrylic polymer binder | 10 parts by weight |
| Ethylene glycol monobutyl ether acetate | 40 parts by weight |

TABLE 4

| | |
|---|---|
| Black pigment (2) | 15 parts by weight |
| Fused quartz frit | 85 parts by weight |
| Ethyl cellulose-type binder | 15 parts by weight |
| Terpineol | 50 parts by weight |

Note (2): A mixed pigment of Cr$_2$O$_3$, Fe$_2$O$_3$, MnO and CoO

The label material for firing thus obtained was fixed on a MnZn ferrite piece and the piece was fired at 1000° C. for 1 hour. During the firing process, the adhesive and the organic binder components were completely decomposed and burned out before the glass frit started to fuse, and then a black bar code pattern was formed and firmly held on the white substrate with clear contrast.

EXAMPLE 6

The composition as shown in Table 5 below was processed into a sheet in the similar manner as in Example 4 and the ink composition as shown Table 6 below was printed on the sheet by screen printing process to form an arrangement corresponding to a specified bar code pattern.

TABLE 5

| | |
|---|---|
| Al$_2$O$_3$ | 15 parts by weight |
| Borosilicate lead-type glass frit | 85 parts by weight |
| Acrylic polymer binder | 10 parts by weight |
| Ethylene glycol monobutyl ether acetate | 40 parts by weight |

TABLE 6

| | |
|---|---|
| Black pigment (3) | 15 parts by weight |
| Borosilicate lead-type glass frit | 85 parts by weight |
| Ethyl cellulose-type binder | 15 parts by weight |
| Terpineol | 50 parts by weight |

Note (3): A mixed pigment of Cr$_2$O$_3$, Fe$_2$O$_3$, MnO and CoO

The label material body for firing thus obtained was fixed on the surface of a stainless steel piece which had been previously heat-treated at 600° C. to form a thin oxide layer. When the stainless steel piece was fired at 600° C. for 10 minutes, the adhesive and the organic binder components were completely decomposed and burned out before the glass frit started to fuse. A black bar code pattern was formed and firmly held on the white substrate with clear contrast.

It was found that the oxide layer previously formed on the surface of stainless steel piece and the glass frit were fused to form a single layer and the label and the piece was extremely strongly adhered.

EXAMPLE 7

Using the ink ribbon cartridge as obtained in Example 1 and a thermal transfer printer, a label material supporting body for firing was produced by printing a pattern design corresponding to a specified bar code pattern on the ink receiving layer of the ink receiving flexible sheet as obtained in Example 4.

The label supporting material thus obtained was fixed on a glass product through the adhesive layer as in Example 4 and the product was fired under the same conditions as in Example 4. A black bar code pattern was formed on the which substrate with clear contrast and firm adhesion.

| Example 8 (Circuit pattern) | |
|---|---|
| Gold powder | 70 parts by weight |
| Glass frit (borosilicate lead) | 5 parts by weight |
| Carnauba wax | 10 parts by weight |
| Paraffin wax | 12 parts by weight |
| Vaseline | 3 parts by weight |

The above composition was processed into an ink ribbon for thermal printing in the same manner as in Example 1. The composition as indicated below was formed into sheet in the same manner as in Example 4. Using the ink ribbon obtained as above and a thermal transfer printer, a conductive circuit plan of gold was printed on the sheet obtained as above. After fixing the gold circuit plan on an alumina substrate through adhesive layer while carefully avoiding the formation of air bubbles, the substrate was fired at 800° C. It was found that a gold circuit pattern was formed on the alumina substrate and the pattern was highly conductive without crack, pinhole, disconnection and the like.

| | |
|---|---|
| Al$_2$O$_3$ powder | 5 parts by weight |
| Borosilicate lead glass frit | 95 parts by weight |
| Acrylic polymer-type binder | 10 parts by weight |
| Acetate | 40 parts by weight |

Figure 1:
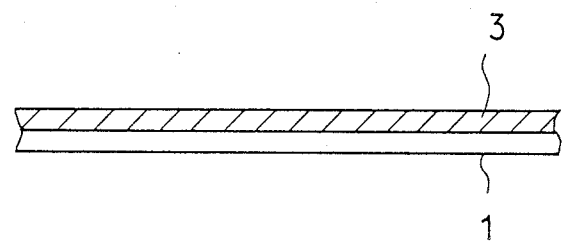
FIG. 1 indicates a cross section of the ink ribbon for press printing obtained in Example 2.
Figure 2:
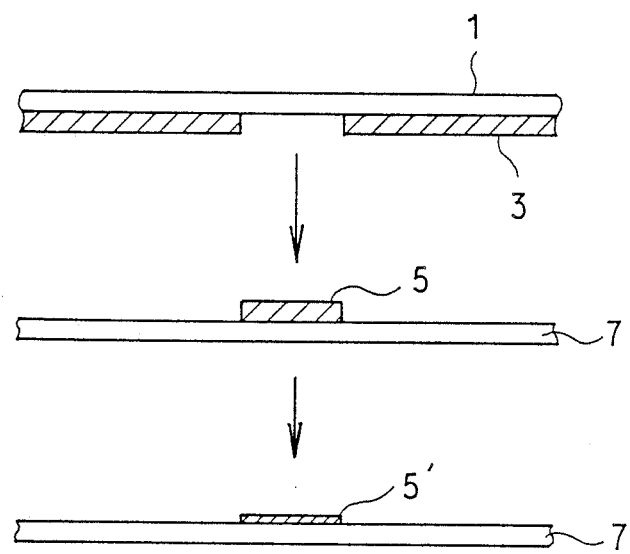
FIG. 2 is a cross section illustrating a process for forming a circuit pattern on a ceramic substrate using the ink ribbon for press printing obtained in Example 2.
Figure 3:
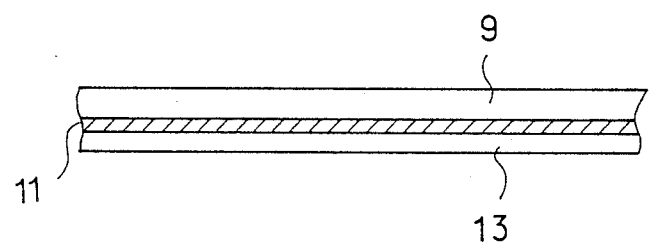
FIG. 3 is a cross section indicating an ink receiving flexible sheet for firing obtained in Example 4.
Figure 4:
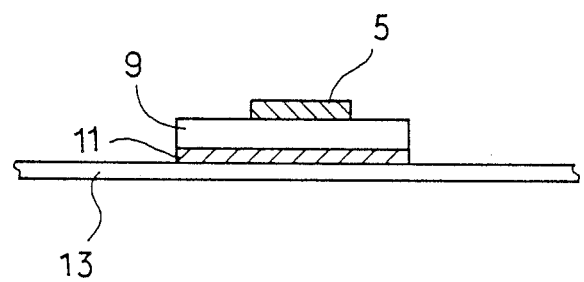
FIG. 4 is a cross section of a label material supporting body for firing obtained with the use of the sheet indication in FIG. 3.

We claim:

1. An ink-receiving flexible sheet which will not deform upon firing, having an adhesive layer and an ink-receiving layer, the ink-receiving layer containing an inorganic material selected from the group consisting of metallic powder and metallic oxide powder, an organic binder and a glass frit and being formed on one surface of the adhesive layer.

2. An ink-receiving flexible sheet which will not deform upon firing, having an adhesive layer and an ink-receiving layer, the ink-receiving layer containing an inorganic material which is a pigment, an organic binder and a glass frit, and being formed on one surface of the adhesive layer.

3. A sheet according to claim 1 or 2 wherein the inorganic material is in the form of fibers.

4. A sheet according to claim 1 or 2, which further comprises a releasable substrate formed on the other surface of the adhesive layer to cover the same.

5. A sheet according to claim 1 or 2 further containing a flexible support member between the ink receiving layer and the adhesive layer.

* * * * *